United States Patent [19]

Muto

[11] 4,224,556

[45] Sep. 23, 1980

[54] DRIVE CIRCUIT FOR ELECTROSTATIC DEFLECTION TYPE CATHODE-RAY TUBE

[75] Inventor: Yasuhiko Muto, Tokyo, Japan

[73] Assignee: Trio Kabushiki Kaisha, Tokyo, Japan

[21] Appl. No.: 11,643

[22] Filed: Feb. 12, 1979

[30] Foreign Application Priority Data

Feb. 24, 1978 [JP] Japan .................................. 53-22355

[51] Int. Cl.$^3$ ............................................ H01J 29/74
[52] U.S. Cl. ................................................ 315/396
[58] Field of Search ............................... 315/396, 397

[56] References Cited

U.S. PATENT DOCUMENTS

| 3,628,083 | 12/1971 | Holmes et al. | 315/397 X |
|---|---|---|---|
| 3,781,589 | 12/1973 | Brockmann | 315/397 X |
| 3,983,452 | 9/1976 | Bazin | 315/397 |
| 4,096,416 | 1/1978 | Henley | 315/397 X |

OTHER PUBLICATIONS

"Amplifier Generates Linear Bipolar Current Sweep", by A. Ramaswamy et al., Defense Electronics Research Lab, India, p. 68, Edn., 2/5/78.

Primary Examiner—Malcolm F. Hubler
Attorney, Agent, or Firm—Gerald J. Ferguson, Jr.; Joseph J. Baker

[57] ABSTRACT

A drive circuit for an electrostatic deflection type cathode-ray tube where the drive circuit includes an amplifier and a load. At least one diode is connected between the output of the amplifier and the load and at least one push-pull emitter follower circuit is provided, the bases of whose transistors are connected to opposite terminals of the diode, the cathode-ray tube being deflected by the output of the push-pull emitter follower circuit.

13 Claims, 3 Drawing Figures

DRIVE CIRCUIT FOR ELECTROSTATIC DEFLECTION TYPE CATHODE-RAY TUBE

BACKGROUND OF THE INVENTION

1. Field of the Invention

This invention relates to an improvement in the drive circuit for electrostatic deflection type cathode-ray tube oscilloscopes.

2. Discussion of Prior Art

Conventionally, a cascode amplifier has been used as a drive circuit for electrostatic deflection type cathode-ray tube oscilloscopes (noted simply as drive circuit hereafter in this specification) as shown in FIG. 1.

In other words, the drive circuit shown in FIG. 1 is constructed such that input transistors 1 and 2 and output transistors 3 and 4 comprise a push-pull cascode amplifier; the emitters of the input transistors 1 and 2 connect to the power supply −B through feedback resistors 5 and 6 respectively, the bases of the output transistors 3 and 4 are grounded, their collectors connected to the power supply +B through collector load resistors 7 and 8, and the collector outputs of output transistors 3 and 4 are impressed upon the vertical deflection plates of the cathode-ray tube 9.

However, the collector output capacitance 10 of the output transistors 3 and 4, the stray capacitance 11 of the circuit, and the interelectrode static capacitance 12 of the cathode-ray tube are present respectively between the grounds. Consequently, the output impedance and the current of the said drive circuit are determined by the three above-mentioned electrostatic capacitances 10, 11 and 12 not to mention the sensitivity of the cathode-ray tube and the technique employed for leading out the terminals of the deflection plates.

Thus, when operating the above cascode amplifier at high speed and large amplitude, problems arise. For example, when a positive input pulse is impressed upon input terminal 13 and a negative input pulse upon input terminal 14, input transistor 1 and output transistor 3 become conductive and the electric charges of the three electrostatic capacitances 10, 11 and 12 shown at the upper side of FIG. 1 are discharged to the power supply −B through output transistor 3 and input transistor 1 as shown by the dot-and-dash line. On the other hand, input transistor 2 and output transistor 4 become nonconductive and the three electrostatic capacitance 10, 11 and 12 shown at the lower side of FIG. 1 are charged by power supply +B as shown by the broken line in FIG. 1. Consequently, the response speed for output transistor 4 becomes nonconductive is determined by the time constant product of the output circuit of the cascode amplifier—that is, the product of the combined electrostatic capacity $C_L$ of the three electrostatic capacitances 10, 11 and 12 and the resistance value $R_{L8}$ of load resistor 8. Thus, a shortcoming is that the response speed is delayed considerably compared to that for output transistor 3 becomes conductive.

In order to achieve a high speed operation, the combined electrostatic capacity $C_L$ and the load resistance $R_L$ must be made sufficiently small. However, when the resistances of load resistors 7 and 8 are reduced, power consumption increases. Also, in order to reduce the electrostatic capacity, the high speed cathode-ray tube is so constructed that the terminals of the deflection plates are led directly out with a side pin to make the lead wire shorter. This makes the high speed cathode-ray tube expensive. Furthermore, the said combined electrostatic capacity $C_L$ has element errors, and in order to correct them, it is necessary to widen the range of correction and adjustment by peaking, etc. So, it has a shortcoming in that special care is required in the selection and control of components used.

SUMMARY OF THE INVENTION

The object of this invention is to provide an improved drive circuit that eliminates the above shortcomings.

Other objects and advantages of this invention will be apparent from a reading of the following specification and claims taken with the drawing.

DETAILED DESCRIPTION OF PREFERRED EMBODIMENTS OF THE INVENTION

Figure 1:
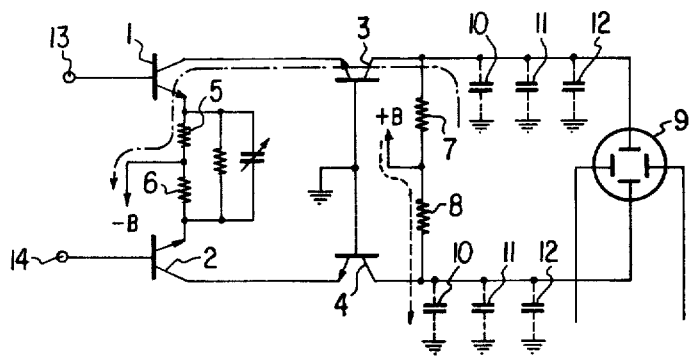
FIG. 1 is a circuit diagram of a conventional drive circuit.

Reference should be made to the drawing where like reference numerals refer to like parts.

Figure 2:
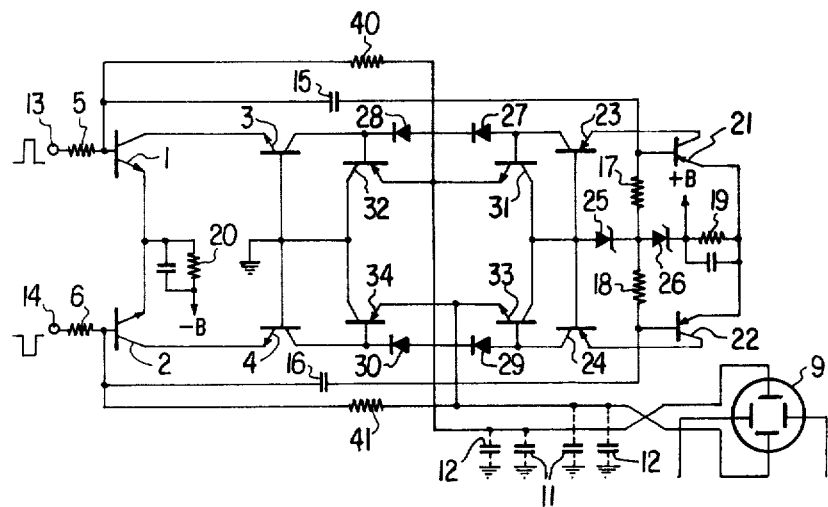
FIG. 2 is a circuit diagram of an illustrative drive circuit in accordance with one embodiment of this invention.

FIG. 2 is a circuit diagram of an illustrative drive circuit in accordance with a first embodiment of the invention, in which a well-known active element load circuit is used as the load of the cascode amplifier. A first push-pull cascode amplifier is comprised of grounded emitter connection input transistors 1 and 2 that connect to power supply −B through an emitter resistor 20; to input terminals 13 and 14 by negative feedback resistors 5 and 6 connected to the bases; and to grounded base output transistors 3 and 4 connected to the collectors.

A second push-pull cascode amplifier is comprised of grounded emitter connection transistors 21 and 22, the bases of which are fed by the output of a differential circuit comprising capacitors 15 and 16 and resistors 17 and 18 connected to the bases of transistors 1 and 2 and the collectors of which are connected to transistors 23 and 24. The amplifiers are so connected that the second cascode amplifier becomes the load of the first cascode amplifier through series diodes 27, 28 and 29, 30 connected in the same forward direction as the collectors and emitters of the output transistors 3 and 4. The common terminal of resistors 17 and 18 is connected to power supply +B through Zener diode 26 and the bases of transistors 23 and 24 connect to the common connection point of resistors 17 and 18 through a Zener diode 25. The emitters of transistors 21 and 22 are both connected to power supply +B through a resistor 19. Transistors 21 and 22 are complementary transistors of transistors 1 through 4.

A first push-pull emitter follower circuit is employed wherein the respective emitters of (a) a transistor 31 whose base connects to the anode of diode 27 and whose collector connects to the anode of Zener diode 25 and (b) a transistor 32 whose base connects to the cathode of diode 28 and whose collector is grounded are connected in common. The common connection point is connected to the base of input transistor 1 through a negative feedback resistor 40 as well as to one of the deflection plates of cathode-ray tube 9. Similarly, a second push-pull emitter follower circuit is employed wherein the respective emitters of (a) a transistor 33 whose base connects to the anode of the diode 29 and whose collector connects to the anode of Zener diode 25 and (b) a transistor 34 whose base connects to the cathode of diode 30 and whose collector is grounded are connected in common. The common connection point is connected to the base of input transistor 2 through a negative feedback resistor 41 as well as to the other deflection plate of cathode-ray tube 9. Here, transistors 31 and 33 are the same type as output transistors 3 and 4 and transistors 32 and 34 are complementary transistors of output transistors 3 and 4. Negative feedback resistors 5, 6 and 40, 41 determine the degree of amplification.

In operation, when a positive high speed pulse is impressed upon input terminal 13 and a negative high speed pulse to input terminal 14, input transistor 1 and output transistor 3 become conductive and input transistor 2 and output transistor 4 become nonconductive. The above-mentioned positive and negative pulses are also impressed upon transistors 21 and 22 through capacitors 15 and 16. Transistors 21 and 23, being complementary transistors of output transistor 3, become nonconductive. Transistors 22 and 24, being complementary transistors of output transistor 4, become conductive. Also, the base of transistor 31 is biased in the reverse direction and the base of transistor 32 is biased in the forward direction so that transistor 31 becomes nonconductive and transistor 32 becomes conductive and an output appears at the emitter of transistor 32 which drives cathode-ray tube 9. Similarly, transistor 34 becomes nonconductive, transistor 33 becomes conductive and an output appears at the emitter of transistor 33 which drives cathode-ray tube 9.

Furthermore, the output impedance of transistors 31 through 34 is very low since $R_{OUT}=[(26\times 10^{-3})/I_e+(R_{ON}+r_b)/h_{fe}]$, when the resistance of the transistors 3, 4, 23 and 24 at on-state is $R_{ON}$, the current amplification factor of transistors 31 through 34 is $h_{fe}$ and the emitter current is $I_e$. Consequently, the stray electrostatic capacitance 11 in the wiring, etc. and the interelectrode static capacitance 12 of cathode-ray tube 9 can be ignored and high speed operation can be easily achieved without any problem.

When the polarity of the high speed pulses impressed on input terminals 13 and 14 changes to the opposite polarity from the above case, input transistor 2, output transistor 4 and transistors 21, 23, 31, and 34 all become conductive and input transistor 1, output transistor 3, and transistors 22, 24, 32, and 33 all become nonconductive. The operation is the same as that stated above.

Zener diodes 25 and 26 are for bias stability of transistors 21 through 24. They also serve as power supply for transistors 31 through 34. And, the diodes 27 through 30 act to prevent the cross-over distortion of the transistors 31, 32, 33 and 34. Resistors 5, 6, 40 and 41 establish gain in the circuit.

Figure 3:
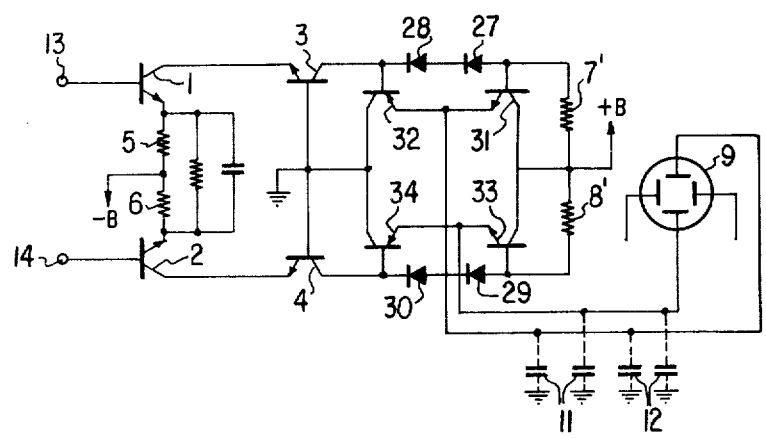
FIG. 3 is a circuit diagram of an illustrative drive circuit in accordance with a further embodiment of this invention.

FIG. 3 is a circuit diagram of a drive circuit in accordance with a further embodiment. The difference from the circuitry of FIG. 2 is that resistors are used as a load instead of an active element load circuit. A push-pull cascode amplifier is comprised of grounded emitter input transistors 1 and 2 whose bases connect to input terminals 13 and 14, whose emitters connect to power supply −B through negative feedback resistors 5 and 6 and whose collectors connect to grounded base connection output transistors 3 and 4. The collectors of output transistors 3 and 4 are so connected that power supply +B is supplied through (a) a load resistor 7' and diodes 27 and 28 in series connection and (b) a load resistor 8' and diodes 29 and 30 in series connection.

First push-pull emitter follower circuit comprising transistors 31 and 32 and second push-pull emitter follower circuit comprising transistors 33 and 34 are the same as the circuits shown in FIG. 2. However, in this embodiment, the collectors of transistors 31 and 33 connect directly to power supply +B.

The operation of the drive circuit of FIG. 3 is virtually the same as that of FIG. 2. Thus, a detailed explanation is omitted, however, a simplified explanation is as follows. When a high speed pulse is inputted to input terminal 13 and a negative high speed pulse to input terminal 14, input transistor 1, output transistor 3 and transistors 32 and 33 all become conductive and drive cathode-ray tube 9. At this time, input transistor 2, output transistor 4 and transistors 31 and 34 are nonconducting and the time constant of input transistor 2 and output transistor 4 become off-state can be determined by the product of the collector output capacity of output transistor 4 and the load resistance. The impedance is lowered by the emitter follower output circuit of transistors 31 through 34. Thus, the stray capacitance 11 of the wiring, etc. and the interelectrode static capacitance 12 of cathode-ray tube 9 can be ignored and high speed operation is possible.

As explained above, when this invention is used, the time constant of the nonconductive output transistors of the push-pull cascode amplifier connected to the input terminal can be made very small. Thus, the stray electrostatic capacitance of the wiring to the cathode-ray tube and the interelectrode static capacitance of the cathode-ray tube can be ignored. Consequently, cathode-ray tubes can be made high speed without selecting a special type cathode-ray tube. Even if the cathode-ray tube is of a type where the deflection plate terminal is not directly led out from the deflection plate with a side pin, it can be used without problem. Also, the circuitry of the present invention is effective without making the output lead wire from the deflection plate extremely short.

Furthermore, the correction range of peaking, etc. can be minimized when correcting element errors, etc. of stray static capacitance and interelectrode static capacitance of the cathode-ray tube. Also, since the output from the cathode-ray tube deflection plate is supplied from an emitter follower, a constant voltage drive results. And, because the emitter follower is used with a capacitance load, the load resistance R during low speed operation results in large resistance R when frequency decreases based on the relationship of $R=1/\omega C$. Thus, it is effective with small power consumption. Here, C is the static capacitance that loads the emitter follower. It is also effective in that the dynamic range is large during high speed operation.

What is claimed is:

1. In a drive circuit for an electrostatic deflection type cathode-ray tube where the drive circuit comprises first and second amplifiers connected in push-pull relationship and first and second loads respectively connected thereto, the improvement of a power supply connected to said first and second loads, a first emitter follower transistor, the base and collector of which are connected across the first load and a second emitter follower transistor, the base and collector of which are connected across the second load, the emitters of said first and second emitter follower transistors being respectively connected to first and second deflection plates of the cathode-ray tube so that the first deflection plate is charged from said power supply through said first emitter follower transistor in response to the first and second amplifiers being respectively turned off and on by input signals applied thereto and the second deflection plate is charged from said power supply through said second emitter follower in response to the first and second amplifiers being respectively turned on and off by input signals applied thereto whereby said first and second emitter follower transistors increase the operating speed of the deflection-type cathode-ray tube.

2. In a drive circuit for an electrostatic deflection type cathode-ray tube where the drive circuit comprises first and second amplifiers connected in push-pull relationship and first and second loads respectively connected thereto, the improvement of first and second emitter followers for respectively connecting said first and second amplifiers to first and second deflection plates of the cathode-ray tube.

3. The improvement as in claim 2 where said first and second emitter followers each comprise transistors.

4. The improvement as in claims 1 or 2 where each said first and second loads is a resistor.

5. The improvement as in claims 1 or 2 where each said first and second loads includes an active element.

6. The improvement as in claim 5 where each said first and second loads comprises a cascode amplifier.

7. The improvement as in claims 1 or 2 where each said first and second amplifiers is a grounded emitter amplifier.

8. The improvement as in claims 1 or 2 where each said first and second amplifiers is a grounded base cascode amplifier.

9. The improvement as in claims 1 or 3 including third and fourth emitter follower transistors, said first and third transistors being connected in push-pull relationship and said second and fourth transistors also being connected in push-pull relationship.

10. The improvement as in claim 9 including first unidirectional current means connected between the output of said first amplifier and said first load and second unidirectional current means connected between the output of said second amplifiers and said second load.

11. The improvement as in claim 10 where the bases of the first and third transistors are connected to opposite terminals of said first unidirectional current means and the bases of said second and fourth transistors are connected to opposite terminals of said second unidirectional current means.

12. The improvement in claim 10 where said unidirectional current means are diodes.

13. The improvement in claim 12 where each unidirectional current means comprises a pair of diodes.

* * * * *